United States Patent [19]
Knappenberger
[11] 3,792,383
[45] Feb. 12, 1974

[54] HYBRID STRIP TRANSMISSION LINE CIRCUITRY AND METHOD OF MAKING SAME

[75] Inventor: Thomas A. Knappenberger, Phoenix, Ariz.
[73] Assignee: Motorola, Inc., Franklin Park, Ill.

[22] Filed: June 21, 1971
[21] Appl. No.: 154,810

[52] U.S. Cl. .............. 333/84 M, 29/600, 317/101 B
[51] Int. Cl....... H01p 3/08, H01p 11/00, H01p 1/30
[58] Field of Search...... 317/101 R, 101 A, 101 B, 317/101 C, 101 CB, 101 CC, 101 CW, 101 CE, 101 D, 101 F, 101 CM; 174/68.5; 333/84, 84 M; 29/600, 601; 330/53–56

[56] References Cited

UNITED STATES PATENTS

| | | | |
|---|---|---|---|
| 2,938,175 | 5/1960 | Sommers et al. | 333/6 |
| 3,433,888 | 3/1969 | Tally et al. | 174/68.5 |
| 2,876,393 | 3/1959 | Tally et al. | 317/101 CM |
| 3,629,730 | 12/1971 | Penzei | 333/84 M X |
| 3,155,881 | 11/1964 | St. Jean | 317/101 CM |
| 3,038,105 | 6/1962 | Brownfield | 174/68.5 X |

OTHER PUBLICATIONS

Canning et al. – "Electrical Connection Device" in IBM Technical Disclosure Bulletin Vol. 9 No. 4 September 1966; p. 361.

*Primary Examiner*—Rudolph V. Rolinec
*Assistant Examiner*—Marvin Nussbaum
*Attorney, Agent, or Firm*—Vincent J. Rauner; Victor Myer

[57] ABSTRACT

A stripline circuit using discrete and distributed circuit components is disclosed wherein the discrete members are fixed to one ground plane, the leads thereof extend through openings in the ground plane and attached dielectric board through a flexible distributed circuit carrier and are soldered to the strip circuit being carried by the flexible carrier. The covering (second) ground plane and attached dielectric board has an access opening on the opposite side of the circuit from the discrete components for enabling the soldered connection to be made. The access openings in the covering ground plane and attached dielectric member are of sufficient size to permit flexing of the flexible circuit carrier during differential thermal expansion of the leads and the dielectric members. The same is true for the other ground plane and attached dielectric member. Stress-free and crack-free solder connections are thus achieved, and the solder connections can be removed for servicing and the like of the discrete components even though the ground planes, dielectric boards and circuit carrier are bonded together.

8 Claims, 8 Drawing Figures

INVENTOR
Thomas A. Knappenberger
BY
Mueller & Aichele
ATTY'S.

VIEW A-A

INVENTOR

BY Thomas A. Knappenberger

Mueller & Aichele

ATTY'S.

HYBRID STRIP TRANSMISSION LINE CIRCUITRY AND METHOD OF MAKING SAME

BACKGROUND OF THE INVENTION

This invention relates to hybrid microwave stripline electronic circuits wherein discrete components are combined with distributed components and it is an object of the invention to provide improved circuits of this nature and improved methods of making the same.

The needs of space borne equipment have required smaller and smaller electronic packages which in turn have required smaller circuit assemblies. Because the size of distributed components on stripline circuits is a function of frequency of the circuits, at lower frequencies stripline circuits using only distributed components become too large to meet the requirements. One way of overcoming this problem is to use a combination of discrete components and distributed components to form the necessary circuitry in the required size.

In the stripline version of microwave circuitry, most of the electric field is contained between the ground plane boards. It is difficult to accommodate discrete components because lead lengths of the discrete components must be short. Components must be mounted either between the ground planes or, outside the ground planes with circuit connections made to distributed components within the ground planes. The techniques required to do this are difficult and costly. An alternative is to use the microstrip version of such circuits and to connect the discrete components to the distributed components on the front surface of the microstrip rather than on the ground plane side. The major problem with this approach is that an electric field extends above the circuit board which necessitates leaving a space above the board of approximately six ground plane spacings. This is true because any relative motion of parts external to the microstrip but within the electric field will cause changes in the performance of the microstrip. This area of field represents lost space and therefore causes larger electronic packages.

In order to minimize the size of stripline microwave circuitry, it is necessary to be able to mount the discrete components near the distributed components as well as to contain the electric field, and it is an object of the invention to provide an improved method and apparatus to achieve the foregoing object.

It is a further object of the invention to provide apparatus and methods of the nature indicated which allows the electronic package to be minimized in size and at the same time enhances reliability, producibility, performance and cost.

It is a further object of the invention to provide improved apparatus and method of the character indicated wherein, in a stripline microwave circuit, discrete components are attached exteriorly to one side of the circuit and the leads thereof are attached (as by solder) interiorly thereof to the distributed constants circuit on the other thereof, in an accessible manner and in a temperature differential stress-free manner.

The invention features miniature ruggedized hybrid strip transmission line circuitry formed by a combination of discrete components and distributed components arranged judiciously to supply the dielectric and gound plane to the distributed components while providing access to the discrete components. Selective removal of the ground plane is necessary to maintain the transmission line characteristics.

Relief in the ground planes and dielectric boards provides stress relief to overcome stresses induced by differential expansion of component lead materials and dielectric board materials. In ruggedized circuitry, discrete component bodies must be firmly secured to the circuit board and therefore stress relief is vitally needed.

The open areas or windows through the upper ground plane are large to provide areas for interconnection and inspection of interconnections and circuitry. These are not normally available in stripline circuitry. A key point is that in military hardware fractured solder or conductive cement (bond) joints have made it extremely desirable to be able to inspect the entire joint under microscopic examination to provide integrity of the joint even after assembly and storage.

Such construction allows lead lengths of components to be minimized while still containing the inductive field. The shorter lead length minimizes undesired inductance at the higher frequencies for example above 100mHz, such that discrete components can be used in applications where formerly only distributed components could be used.

Discrete component mounting techniques according to the invention permit stripline circuitry to be laminated where formerly it had to be enabled to be disassembled to permit access to discrete components. Laminating the stripline allows more uniform circuit performance because it eliminates dimensional variations from assmbly to assembly.

According to the invention, ground planes may be interconnected around the periphery of the boards with a plated edge using well understood printed circuit techniques for a foil edge strap. Mode suppression and internal grounds are provided by flexible C foil straps or ductile plated through holes. These techniques allow for stress relief of thermally induced expansion stresses.

Ground planes are locally relieved to allow discrete component leads to pass through the ground planes without short-circuiting the leads to the ground plane. As much dielectric as possible is left around the component lead to disturb the electric field as little as possible.

In most active circuits heat is generated in the discrete devices (diodes, transistors, resistors, etc.). The invention provides an optional integral heat sink to mount the discrete devices in the circuit. It minimizes lead lengths (hence, inductance) and provides efficient thermal paths. It provides accessibility for inspection or removal of components without disturbing the rest of the circuitry. It makes provision for thermal expansion stresses encountered due to thermal expansion differentials of dielectrics, metal conductors and devices.

In one version described where circuits are printed on the front and back of thin dielectric material, a hybrid coupler can be formed with registration locked into the assembly at time of fabrication. This is an important feature to cut down variation in performance of such circuits.

Variations of the invention can take the form of using a thick slab of metal for the bottom ground plane to form an integral heat sink, mounting base and ground plane. High heat dissipating circuits can thus be accommodated. For example, 30 watts can be dissipated in less than 3 cubic inches. Similarly, the top ground plane can be made to form an integral cover. In the subject invention, as already indicated, all components are mounted on the outside of the bottom ground plane and all connections, solder joints or other conducting cement joints can be made from the outside. The assembly is laminated together and there is no need to separate ground planes, dielectric or circuit patterns. All distributed components and transmission lines are covered with dielectric and ground plane to form the high frequency circuits. Access windows are provided in the top dielectric board to permit soldering or otherwise connecting the leads of discrete components to the center conductors. Component bodies are mounted to the bottom dielectric board and their leads are fed through the relief holes in the bottom ground plane and dielectric board. Small leadless discrete components such as chip capacitors are soldered or conductively bonded directly to the center conductor through access windows in the top dielectric board.

Models constructed used copper-clad glass Teflon dielectric material about one-sixteenth inch thick for the top and bottom ground plane boards. The circuit carrier was a thin, 0.010 thick Teflon dielectric material with a circuit etched on one or both sides depending on circuit requirements. The top and bottom ground planes are similar except that windows are cut in the top at all strategic soldering locations. The entire assembly is heat laminated using a matched dielectric bonding film on either side of the circuit carrier board.

Very high level shock and vibration can be tolerated by circuitry of the inventive construction because of its inherent ruggedness.

Cracked solder joints due to differential thermal expansion of materials are eliminated in this invention by allowing relief in both top and bottom ground plane dielectrics so that the thin center circuit carrier flexes in diaphram action to eliminate thermal stresses. Difficulties with the prior art devices have included, for example, high cost of fabrication, difficulty in inspection, test and trouble-shooting, non-repeatability in performance due to non-repeatability of ground plane spacing, intermittant connections, stresses induced in assembly and coupler registration, difficulty of repair and cracked solder joints due to differential thermal expansion.

The high cost of fabrication of stripline circuitry is due, in part, to inaccessibility to inner circuits causing difficulties with interconnections to components and the ground plane. Also because circuits must be clamped together to permit accessibility to certain conductors, non-uniformity of ground plane spacing occurs because clamping causes local deflections.

Probably the biggest problem with prior circuits has been the inconsistency of circuit performance. Because of the bolted-together construction of stripline circuitry, variations in ground plane spacing occurs with each assembly and disassembly. Loosening of the assembly occurs with thermal cycling also causing variations in ground plane spacing and homogeniety of dielectric. Internal discrete components and interconnections inside the sandwich become difficult to implement reliably.

Inspection of the circuitry after the sandwich is constructed is virtually impossible and therefore much disassembly time is required to inspect, troubleshoot and repair circuits of the nature involved.

When ground planes and dielectrics are clamped together as in the prior art, non-uniformity in clamping pressure causes circuit variations. Very stiff plates and many fastening devices are needed to keep the clamping pressure uniform at the expense of larger assemblies and costly fabrication and assembly because of complexity. One of the greatest disadvantages is the difficulty of making reliable interconnection between circuit and ground plane and between opposite ground planes. Many such interconnections are required on most stripline circuits to minimize effects of varying ground circuits and to suppress moding. Because curcuit boards and dielectrics must be disassembled to get at discrete components or interconnections, the problem of ground plane to ground plane connection becomes quite difficult to solve economically.

Where circuit element couplers are required, the problem of registration of the assembly becomes a costly trade-off with manufacturing tolerances.

In the subject invention because will interconnections are accessible from the outside, it is possible and in fact very desirable to laminate the assembly together permanently forming perfectly uniform ground plane spacing. Thermal stresses which cause circuit performance changes in clamped circuits do not cause changes in the laminated circuits.

The subject invention eliminates most, if not all, of the drawbacks of the other stripline approaches.

Access to all discrete components and their solder joints permits inspection and trouble-shooting with no disassembly. Repair to the offending portion of the circuits are the only areas disturbed. Therefore, circuit performance is not changed due to disassembly. Ground plane spacing is locked into the assembly by the laminating techniques. Therefore, circuit variations due to non-flat boards or thermal stresses are eliminated. Board flatness is no longer a prime requirement because ground planes remain parallel even when the laminated board assembly is deflected. For the same reason, the number of mounting fasteners can be reduced from typically 50 screws formerly required to keep an assembly flat to four screws needed with this approach to hold the circuit board in place.

Registration is accomplished at the time of production of the circuit carrier with circuit patterns etched on opposite sides of the dielectric carrier material. Once the art work is proven, registration is reproduced automatically.

Because no discrete components are mounted inside the ground planes with blind relief holes, there can be no crushing of components such as chip capacitors and diodes, and no crushing of solder joints. This has been a difficult problem in versions of the stripline circuitry in the prior art. There is also no requirement for spring contacts to interconnect opposite sides of circuitry and circuitry to ground plane. These two advantages definitely enhance the long-term reliability of the circuitry.

The cost of assemblies built using the subject invention are much lower than previous assemblies using other techniques to achieve the same performance. This is because of cheaper fabricated parts, cheaper assembly, cheaper inspection, easier trouble-shooting and repair, and higher yield in production. The size of circuits built using the subject invention are smaller than comparable circuits using other methods because of the elimination of stiffener plates or a clearance space for the electric field.

SUMMARY OF THE INVENTION

According to one form of the invention, a hybrid stripline circuit is provided comprising a pair of ground plane and attached dielectric layers in opposed relationship to each other, such dielectric layers facing each other, a strip circuit member between said facing dielectric layers, said dielectric layers and said circuit member being bonded to each other, at least one access opening in one of said pair of ground plane and dielectric layers for exposing said strip circuit member, and a conductive bonded connection to said strip circuit member made through said access opening.

In carrying out the invention in another form, in a hybrid stripline circuit having a pair of ground plane and attached dielectric layers in opposed relationship to each other with such dielectric layers facing each other and a strip circuit member between said facing dielectric layers, means are provided for enabling the mounting of discrete components fixedly on the exterior of such stripline circuit on one side thereof and attaching the leads thereof to the circuit member from the other side of such stripline circuit in a stress-free and accessible manner comprising a flexible dielectric circuit carrier with said circuit formed thereon disposed between said facing dielectric layers, said circuit facing opposite to the side of attachment of said discrete components, opening means extending through each of said pair of ground plane and attached dielectric layers and terminating at said flexible circuit carrier, said openings being of sufficient size to receive said leads from one side and receive a soldering tool from the other side, a solder connection of said lead to the circuit on said flexible carrier, the extent of said solder connection being substantially less than said opening means.

DESCRIPTION OF THE PREFERRED EMBODIMENTS

Figure 1:
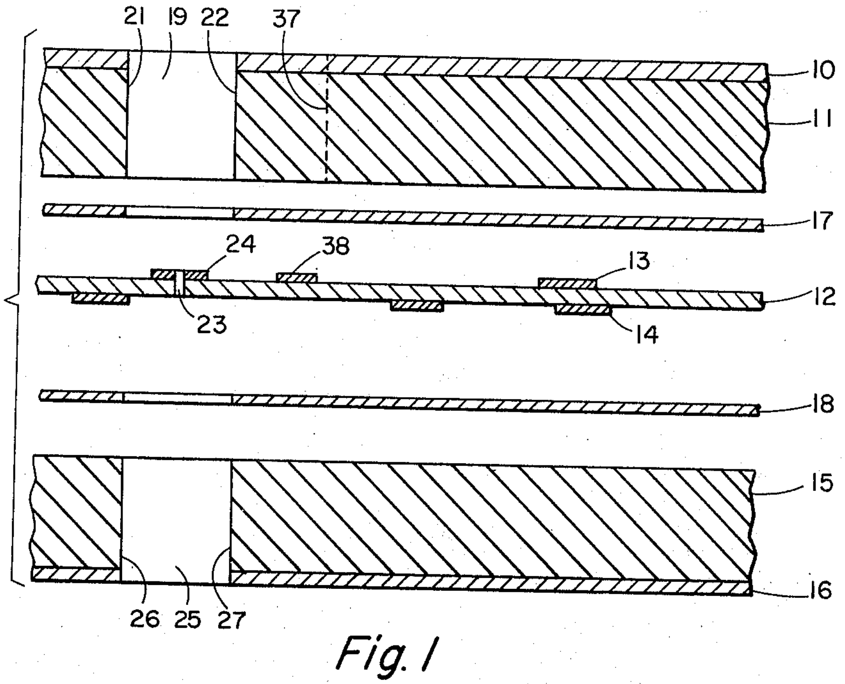
FIG. 1 is a fragmentary exploded sectional view on an enlarged scale of one form of microwave stripline circuit according to the invention.

Referring to the drawings, the basic structure is shown as a microwave stripline member consisting of a ground plane 10, a dielectric layer 11, a dielectric circuit carrier 12, film circuit members 13 and 14, a dielectric layer 15, and a metallic ground plane 16. The ground plane 10 and the dielectric layer 11 may comprise a copper-clad dielectric material such as glass Teflon bonded to each other to form a board as is well known. The ground plane material 10 may be foil, for example, or may be a metallic layer. Similarly, the ground plane 16 and the dielectric layer 15 may comprise a copper-clad dielectric board as described. The circuit carrier 12 may comprise a thin layer of dielectric material such as glass Teflon to which the strip circuit 13 and coupler 14 have been bonded by using well-known techniques.

For example, a thin layer of metal may be bonded to the dielectric carrier 12 and by using photoengraving techniques, the circuits 13 and 14 may be etched out upon the carrier. The carrier 12 may, for example, be about 0.010 inches thick whereas the dielectric layers 11 and 15 may, for example, be about one-sixteenth inch thick in a typical case. Between the dielectric layer 11 and the circuit carrier 12 is a bonding film 17 and between the other side of the circuit carrier 12 and the dielectric 15 is a second bonding film 18. After the appropriate openings have been formed in the ground plane boards 10, 11 and 15, 16 as well as in the circuit carrier 12 and the circuits thereon, as will be described, the sandwich may be assembled, compressed and subject to such temperature as is necessary in order to bond the various layers together into a single monolithic-type structure as may be visualized in FIG. 2.

Figure 7:
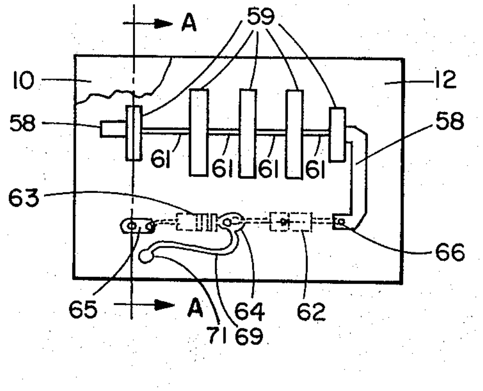
FIG. 7 is a fragmentary plan view illustrating the invention as utilizing both discrete and distributed components.

The bonding films 17 and 18 are one way of providing the necessary adhesive or bonding capability for holding the sandwich together. Other adhesives may be utilized. In the form shown in FIGS. 1 and 2, the bonding film 17 and 18 will have appropriate openings formed to conform to the openings in the ground plane boards so that after the sandwich has been completed, it will be unnecessary to remove any bonding material in the openings within which circuit components are to be connected as will be described. While strip circuit member 13 and coupler circuit 14 have been shown respectively on respective sides of the circuit carrier 12, it will be understood that a strip circuit, for example, 13 on only one side of the circuit carrier may be utilized if desired. While the circuits 13 and 14 are shown as consisting of pieces, referring to FIG. 1, it will be seen that these strip circuits may consist of substantial lengths of strip as will be understood by referring to FIGS. 2 and 7. In FIG. 7 there is shown a typical strip circuit consisting of a transmission line and distributed capacitors and inductors connected to discrete components such as diodes and resistors as will be described.

Figure 2:
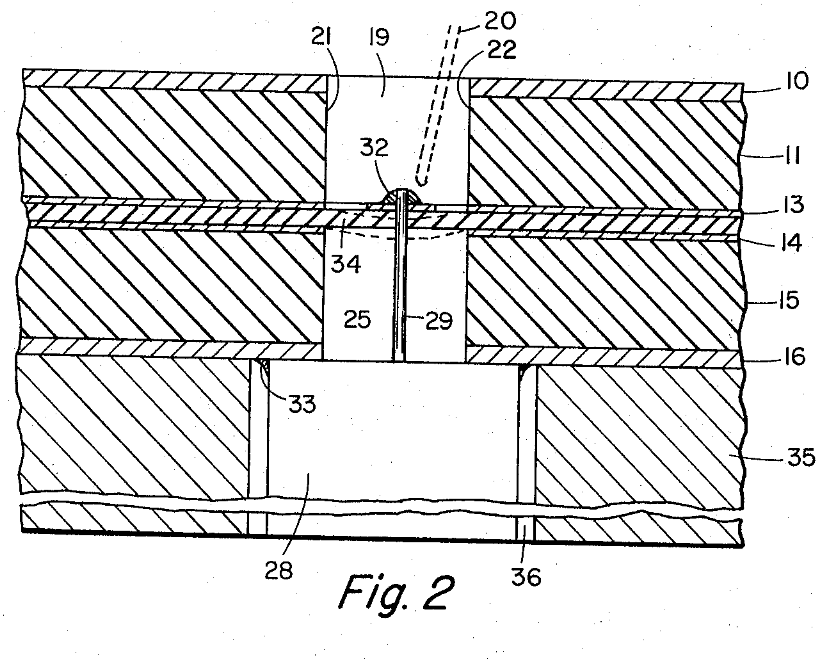
FIG. 2 is a sectional view on an enlarged scale similar to FIG. 1 in assembled form showing another form of the invention.

The ground plane board 10 and 11 has an opening 19 extending therethrough, which opening has sidewalls 21 and 22 of such size that a refined soldering tool 20, for example, may be disposed therein as shown in FIG. 2 for making a solder connection. A hole 23 is formed in the circuit carrier 12 and through a circuit pad 24 thereon, and a hole 25 having sidewalls 26 and 27 is formed in the ground plane board 15, 16.

In the bonded-together sandwich, the holes 19, 23 and 25 are in registry with each other so that when a discrete component such as a resistor 28, for example, is intended to be attached to the structure, a lead 29 of the resistor passes through opening 25 and opening 23, and projects into the opening 19 whereupon by use of the soldering tool shown by the dotted outline 20 in FIG. 2 may be used to solder the end of lead 29 to the circuit pad 24, the solder being shown by the reference character 32. Prior to the making of the solder connection (32), the resistor 28 is firmly affixed to the ground plane 16 such, for example, as by any suitable adhesive shown by the reference character 33 in FIG. 2. As may be seen in FIG. 2, the lower strip conductor 14 is relieved at the hole 25 so as not to short with the lead 29.

Once the discrete component 28, for example, the resistor, is staked or bonded to the ground plane 16 and the lead 29 is soldered to the strip circuit 13, it is essential that any expansion of the ground plane board 15, 16 relative to that of the lead 29 be taken into account so that the solder joint 32 will remain intact through wide variations in temperature during operation of the stripline circuit. It will be observed that the solder 32 terminates substantially short of the sides 21 and 22 of the opening 19 so as not to add any substantial additional stiffness to the flexibility of circuit carrier 12. The opening 25 is of sufficient size and may be of about the same size as opening 19 whereby if the lead 29 contracts relative to the ground plane board 15, 16 or the ground plane 15, 16 expands relative to the length of lead 29, the portion 34 of the flexible circuit carrier 12 between the holes 19 and 25 can deflect or flex downwardly as shown by the dotted lines thereby relieving any stress which would tend to exist in the solder joint 32.

While the use requirements of a circuit of the type involved requires that the discrete component 28 be firmly staked to the ground plane 16 and the solder connection 32 be made such that it does not crack during the occurrence of differences in temperature, it will be clear that the described provision for the flexing of the flexible circuit carrier 12 enables these desirable objects to be achieved. Thus the structure according to the invention is both enabled to withstand substantial vibrations and gravitational forces because the staking at 33 prevents the component 28 from vibrating relative to the overall structure and the solder connection 33 remains intact by virtue of the ability of the flexible circuit carrier 12 to deflect upon differential thermal expansions taking place.

The opening 19 is an access opening in that it enables the end of lead 29 to be soldered to the strip circuit pad 24 and, if necessary, enables the solder to be removed so that the discrete component 28 and its lead 29 can be removed and replaced should this be desirable. All of the foregoing can be achieved without any disassembly of all of the components of the sandwich once these components have been bonded together.

While solder 32 has been specifically referred to, it will be understood that this term is to be taken to mean other forms of connection such, for example, as a conducting adhesive, welding or the like.

A metallic heat sink 35 may be attached to the structure, for example, as at the ground plane 16 by any suitable means, screws, for example (not shown) and such heat sink would be provided with suitable openings such, for example, as 36 to accommodate the discrete component resistor 28 or any other components.

While in FIG. 2 only one component, a resistor, has been shown, it will be understood that the invention contemplates any number of discrete components, resistors, capacitors, transistors and the like, all attached to one side of the monolithic sandwich structure, for example, on the side as shown in FIG. 2 with the components being staked to the ground plane 16 and being disposed within appropriate openings within the heat sink member 35. All of the leads of such discrete components which need to be connected to the strip circuit being carried by the flexible carrier 12 will be soldered to such strip circuit from the opposite side of the sandwich, that is, through appropriate access openings provided in the ground plane 10 and the dielectric member 11.

In some instances where desired the ground plane 16 may be dispensed with and its function achieved by the heat sink member 35 which could be bonded (if necessary) to the dielectric member 15.

In FIG. 2 a resistor is shown mounted according to the invention and in FIGS. 1 and 2 the access opening 19 is shown of a certain size to make a solder connection 32. It will be understood that the opening 29 may be larger, for example, as defined by the sidewalls 21 and 37 shown dotted in order that the circuit portion 38 might be contacted if desired through the same opening in the ground plane and dielectric members 10, 11.

Figure 3:
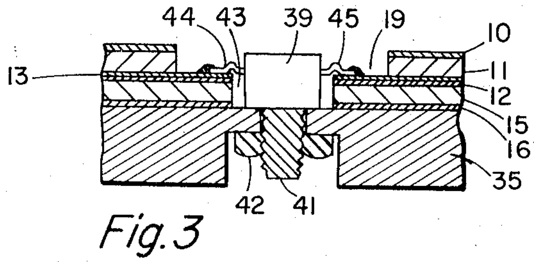
FIGS. 3, 4, 5 and 6 are sectional views on a smaller scale similar to FIG. 2 illustrating the attachment of various discrete components to the microwave stripline circuit according to the invention.

In FIG. 3 the same structural components 10, 11, 12, 15, 16 and 35 are shown, but a transistor 39 is shown connected to the circuit 13 carried by the flexible circuit carrier 12. The transistor 39 may be attached to the assembly as by a threaded stud 41 and nut 42 which engages an appropriate shoulder in the heat sink 35. The transistor 39 is disposed in the opening 19 and sufficient clearance exists between the transistor package and an opening 43 in the dielectric member 15 and ground plane 16 so that the transistor leads 44 and 45 may move slightly with temperature differentials. The ground plane 16 has an opening such that the transistor does not short these members under any circumstances. Foil-like leads 44 and 45 project outwardly from the transistor 39 and are soldered or otherwise attached as described to the strip circuit 13 on the flexible circuit carrier 12. Each of the leads 44 and 45 may include a bend therein as shown in order to enable the transistor to flex slightly in its mounting when temperature differential expansions occur. In this instance also the discrete component 39 is soldered by means of the access opening 19.

Figure 4:
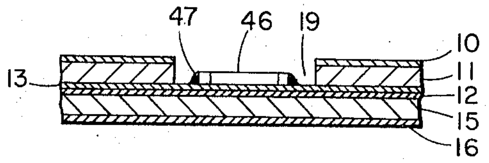

In FIG. 4 the same basic sandwich structure of the stripline circuit is shown, except that in this instance the heat sink is eliminated. The ground plane 10 and dielectric member 11 include an access opening 19 through which a discrete capacitor 46 may be attached as by soldering 47 to the strip conductor 13 carried by the flexible circuit carrier 12.

Figure 5:
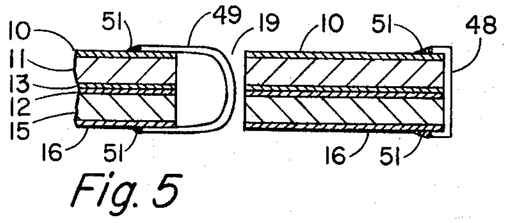

In FIG. 5 the same basic structure of components is shown as in the other Figures, but in addition shorting members 48 and 49 are provided for connecting the ground planes 10 and 16 together. The shorting member 48 is, or may be, exterior to the whole structure whereas the shorting member 49 may be a flexible strap extending through the opening 19 as previously described. In each case, the shorting members 48 and 49 may be bonded or otherwise attached to the ground planes 10 and 16 as by the soldering connections 51, for example.

Figure 6:
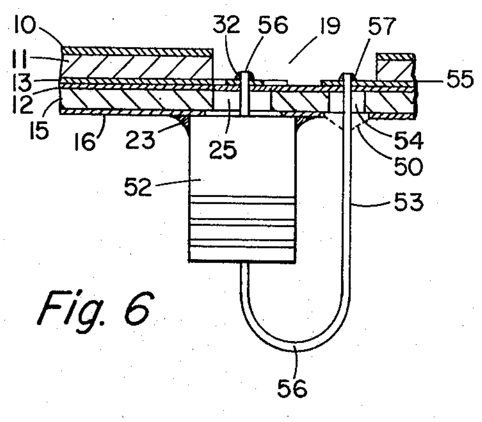

In FIG. 6 a resistor 52 may be attached to the structure in the same manner as described for resistor 28 in connection with FIG. 2. The other lead 53 of the resistor projects through an opening 54 in the ground plane 16 and dielectric member 15, the opening being relieved such that the lead does not short to the ground plane member 16. The end of lead 53 extends into an opening 19 as described which is of sufficient size to accommodate both the solder connections of lead 53 to the strip circuit portion 55 while the other lead 56 is attached to the strip circuit 13 by solder 32 as already described. The lead 53 includes a bend 56 which permits flexing thereof during differential temperature expansion and thus no expansion provision need be made for the solder connection at 57. If desired, the lead 53 may be bonded to the ground plane 16 as shown by the dotted lines 50.

Figure 8:
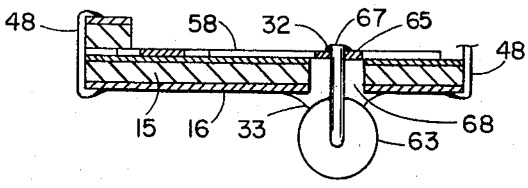
FIG. 8 is a sectional view on a larger scale taken in the direction of the arrows 8—8 of FIG. 7.

In FIG. 7 the same basic structure as in the other Figures is shown in plan view with the top ground plane and dielectric members 10 and 11 removed over substantially all of the surface of the circuit exposing the flexible circuit carrier 12 with a strip circuit disposed thereon. The strip circuit may comprise any desired number of components and, for example, is shown as including a 50 ohm transmission line 58, distributed inductors 59, and distributed capacitors 61. Connected to one end of the 50 ohm transmission line 58 and shown in dotted lines is a discrete diode 62 and connected thereto is a discrete resistor also shown in dotted 63. A circuit connecting pad 64 is shown connecting the diode 62 and resistor 63, and a circuit connecting pad 65 is shown at one end of the resistor 63, the circuit pads 64 and 65 being formed on and carried by the flexible circuit carrier as described. The leads from resistor 63 extend upwardly through the ground plane 16 and dielectric member 15, and are joined, as by soldering, to the circuit pads 64 and 65 through access openings 19 in the upper ground plane and circuit board as previously described. Similarly, one lead of the diode 62 is connected in similar manner to the same circuit pad 64 and the lead at the other end of the diode is connected to one end of the transmission line 58 as by a soldered connection 66. The structure shown in plan view in FIG. 7 is shown in section in FIG. 8, the resistor 63 having its lead 67 shown passing through an opening 68 to be joined to the pad 65. The pad 65 is shown with two openings, one for one lead of the resistor 63 and the other for any other component which needs to be connected thereto. The total extent of the pad 65 would be exposed through the opening 19 in the overlying ground plane and dielectric member as described. Similarly, the pad 64 at the other end of resistor 63 would be exposed through its full extent through an appropriate opening in the upper ground plane and dielectric member.

It will be evident that in mounting various components (FIGS. 2 – 8 inclusive) to the rear side of the stripline as well as to the front side thereof, that numerous openings will have to exist in the upper ground plane and dielectric member 10 and 11 in order to provide for the interconnections. The ground plane 10 itself must, however, be sufficiently continuous that the purpose of the ground plane is adequately served for the frequencies intended to be used with the particular circuit, as has already been alluded to. In order to make certain that the ground plane adequately serves the purpose, the interconnections between the upper and lower ground plane 48 and 49 as has been described is provided.

Extending from the pad 64 is a strip conductor 69 terminating in a pad 71 to which a discrete component could be connected as already described.

A circuit of the type described in the specification has been operated above 500 mHz and can be used as high as 1 gHz or higher.

What is claimed is:

1. A hybrid stripline circuit comprising, a first metallic ground plane having two sides, a first layer of dielectric material having two sides and being bonded at one side to one side of said first ground plane, a flexible dielectric microwave circuit carrier having two sides bonded at one side to the other side of said first layer of dielectric material, a microwave circuit bonded to the other side of said carrier, a second layer of dielectric material having two sides and being bonded at one side to the other side of said carrier, a second metallic ground plane having two sides and being bonded at one side to the other side of second layer of dielectric material, a hole through said first metallic ground plane, a hole through said first layer of dielectric material, a discrete circuit component fixed to the other side of said first ground plane, said discrete circuit component having a lead extending through the holes in said first ground plane and said first layer of dielectric material, said lead including an end, a hole in said second ground plane, a hole in said second layer of dielectric material, a connecting hole in said flexible carrier member and said microwave circuit, the end of said lead extending through said connecting hole and being soldered to said microwave circuit, the opening in said second ground plane and through said second layer of dielectric material being of such size as to enable said soldering, and the extent of said solder joint being less than size of the holes in said first and second dielectric layers whereby flexing of said flexible dielectric carrier is enabled.

2. In a hybrid stripline circuit having a pair of ground plane and attached dielectric layers in opposed relationship to each other with such dielectric layers facing each other and a strip circuit member between said facing dielectric layers, means for enabling the mounting of discrete components fixedly on the exterior of such stripline circuit on one side thereof and attaching the leads thereof to the circuit member from the other side of such stripline circuit in a stress-free and accessible manner comprising a flexible dielectric circuit carrier with said circuit formed thereon disposed between said facing dielectric layers, said circuit facing opposite to the side of attachment of said discrete components, opening means extending through each of said pair of ground plane and attached dielectric layers and terminating at said flexible circuit carrier, said openings being of sufficient size to receive said leads from one side and receive a soldering tool from the other side, a solder connection of said lead to the circuit on said flexible carrier, the extent of said solder connection being substantially less than said opening means.

3. The stripline circuit according to claim 2 wherein said ground planes and dielectric layers and said flexible dielectric circuit carriers are bonded together.

4. A hybrid stripline circuit comprising a pair of ground plane and attached dielectric layers in opposed relationship to each other such dielectric layers facing each other, a strip circuit member between said facing dielectric layers, said dielectric layers and said circuit member being bonded to each other, at least one access opening in one of said pair of ground plane and dielectric layers for exposing said strip circuit member and a solder connection to said strip circuit member made through said access opening.

5. The stripline circuit according to claim 4 including a flexible dielectric circuit carrier to which said strip circuit member is bonded, and said circuit carrier and dielectric layers are bonded together.

6. The stripline circuit according to claim 5 wherein, the other one of said pair of ground plane and dielectric layers has a lead opening opposite the access opening in said first one of said pair of ground plane and dielectric layers, a discrete component is fixed to the ground plane of said other one of said pair of ground plane and dielectric layers, said discrete component includes a lead extending through said lead opening and into said access opening, said solder connection joins said lead to said strip circuit, and the lateral extent of said solder connection is substantially less than the extent of said access opening and said lead opening thereby permitting said flexible circuit carrier to flex.

7. The method of making a hybrid stripline circuit comprising the steps of providing a flexible dielectric carrier with a strip circuit thereon, bonding said flexible carrier between a pair of ground plane and dielectric layers having registering openings on each side of flexible carrier, bonding discrete members on one side of such stripline circuit, and making discrete member lead connections to said strip circuit from the other side of said stripline circuit.

8. The method of making a hybrid stripline circuit comprising the steps of, flexibly supporting a flexible circuit carrier between two relatively rigid ground plane and dielectric insulating members, fixedly mounting a discrete member exteriorly to one of said rigid members and soldering leads to a strip circuit on said flexible circuit carrier through exterior access openings in the other of said rigid members.

* * * * *